US008812934B2

(12) United States Patent
Guyot et al.

(10) Patent No.: US 8,812,934 B2
(45) Date of Patent: Aug. 19, 2014

(54) TECHNIQUES FOR STORING BITS IN MEMORY CELLS HAVING STUCK-AT FAULTS

(71) Applicant: HGST Netherlands B.V., Amsterdam (NL)

(72) Inventors: Cyril Guyot, San Jose, CA (US); Luiz Franca-Neto, Sunnyvale, CA (US); Robert Eugeniu Mateescu, San Jose, CA (US); Zvonimir Bandic, San Jose, CA (US); Qingbo Wang, Irvine, CA (US)

(73) Assignee: HGST Netherlands B.V., Amsterdam (NL)

( * ) Notice: Subject to any disclaimer, the term of this patent is extended or adjusted under 35 U.S.C. 154(b) by 1 day.

(21) Appl. No.: 13/712,956

(22) Filed: Dec. 12, 2012

(65) Prior Publication Data

US 2014/0164873 A1 Jun. 12, 2014

(51) Int. Cl.
*G11C 29/00* (2006.01)
(52) U.S. Cl.
USPC .......................................................... 714/764
(58) Field of Classification Search
USPC .................... 714/764, 200, 205, 207, 719
See application file for complete search history.

(56) References Cited

U.S. PATENT DOCUMENTS

| 3,949,208 A | 4/1976 | Carter |
| 6,839,275 B2 | 1/2005 | Van Brocklin et al. |
| 6,996,017 B2 | 2/2006 | Scheuerlein et al. |
| 7,073,105 B2 * | 7/2006 | Knips et al. ................ 714/719 |
| 8,144,037 B2 | 3/2012 | Monro |
| 8,542,544 B2 * | 9/2013 | Komatsu et al. ............ 365/200 |
| 2010/0277989 A1 | 11/2010 | Elfadel et al. |
| 2010/0332895 A1 | 12/2010 | Billing et al. |
| 2011/0080781 A1 | 4/2011 | Goux |
| 2011/0119538 A1 | 5/2011 | Ipek et al. |
| 2011/0296258 A1 | 12/2011 | Schechter et al. |
| 2011/0307670 A1 | 12/2011 | Franceshini et al. |
| 2011/0317480 A1 | 12/2011 | Lung et al. |

OTHER PUBLICATIONS

Eric Deal, "Trends in NAND Flash Memory Error Correction," Jun. 2009, Cyclic Design, pp. 1-11.
R. Micheloni, et al., "A 4Gb 2b/cell NAND Flash Memory with Embedded 5b BCH ECC for 36MB/s System Read Throughput," 2006 IEEE International Solid-State Circuits Conference, Feb. 6, 2006, Non-Volatile Memory, 7.6, pp. 1-10.
U.S. Appl. No. 13/649,072, filed Oct. 10, 2012.

(Continued)

*Primary Examiner* — Fritz Alphonse
(74) *Attorney, Agent, or Firm* — Steven J. Cahill

(57) ABSTRACT

A data storage system includes a memory circuit comprising memory cells and a control circuit. The control circuit generates a first set of redundant bits indicating bit positions of the memory cells having stuck-at faults in response to a first write operation if a first rate of the stuck-at faults in the memory cells is greater than a first threshold. The control circuit is operable to encode data bits to generate encoded data bits and a second set of redundant bits that indicate a transformation performed on the data bits to generate the encoded data bits in response to a second write operation if a second rate of stuck-at faults in the memory cells is greater than a second threshold. The encoded data bits stored in the memory cells having the stuck-at faults match digital values of corresponding ones of the stuck-at faults.

21 Claims, 3 Drawing Sheets

(56) References Cited

OTHER PUBLICATIONS

H.-S. Philip Wong, et al., "Phase Change Memory," vol. 98, No. 12, Dec. 2010, Proceedings of the IEEE, pp. 2201-2227.
Nak Hee Seong, et al., "SAFER: Stuck-At-Fault Error Recovery for Memories," 2010 43rd Annual IEEE/ACM International Symposium on Microarchitecture, pp. 115-124, Dec. 8, 2010.
Stuart Schechter et al., "Use ECP, not ECC, for Hard Failures in Resistive Memories," ISCA '10 Proceedings of the 37th Annual International Symposium on Computer Architecture, Jun. 2010, pp. 141-152.
U.S. Appl. No. 13/649,007, filed Oct. 10, 2012.
Maddah et al. "Data Dependent Sparing to Manage Better-Than-Bad Blocks," Computer Science Department, University of Pittsburgh, Apr. 30, 2012.
U.S. Appl. No. 13/649,108, filed Oct. 10, 2012.
U.S. Appl. No. 13/712,929, filed Dec. 12, 2012.
"Binomial coefficient," Wikipedia, the free encyclopedia, pp. 1-19, Oct. 3, 2012.
"Combination," Wikipedia, the free encyclopedia, pp. 1-7, Sep. 28, 2012.
"Combinatorial number system," Wikipedia, the free encyclopedia, pp. 1-5, Sep. 24, 2012.
U.S. Appl. No. 13/649,098, filed Oct. 10, 2012.

* cited by examiner

TECHNIQUES FOR STORING BITS IN MEMORY CELLS HAVING STUCK-AT FAULTS

FIELD OF THE DISCLOSURE

The present invention relates to data storage systems, and more particularly, to techniques for storing bits in memory cells having stuck-at faults in data storage systems.

BACKGROUND

Many data communication systems use error correction encoders and decoders to detect and correct errors in data. A data communication system may, for example, correct random errors that are generated at a rate of about $1\times10^{-4}$. To protect against an error rate of about $1\times10^{-4}$, an error correction encoder generates encoded bits having about 10% more bits than its input bits.

Phase change memory (PCM) is a class of non-volatile memory. PCM devices have many advantages over traditional non-volatile flash memory. However, PCM devices may generate a large number of errors that are induced by degradation. For example, a PCM device may generate errors at a rate of $1\times10^{-2}$ or greater.

At the limits of endurance, the error rate in non-volatile memory devices is dominated by degradation. Errors that are caused by degradation include stuck-at faults, which have different statistics and properties than the random errors that are common in data communication systems.

BRIEF SUMMARY

According to some embodiments, a data storage system includes a memory circuit comprising memory cells and a control circuit. The control circuit generates a first set of redundant bits indicating bit positions of the memory cells having stuck-at faults in response to a first write operation if a first rate of the stuck-at faults in the memory cells is greater than a first threshold. First data bits are stored in the memory cells during the first write operation. The control circuit is operable to encode second data bits to generate first encoded data bits and a second set of redundant bits that indicate a transformation performed on the second data bits to generate the first encoded data bits in response to a second write operation if a second rate of stuck-at faults in the memory cells is greater than a second threshold. The first encoded data bits are stored in the memory cells during the second write operation. The first encoded data bits stored in the memory cells having the stuck-at faults match digital values of corresponding ones of the stuck-at faults.

Various objects, features, and advantages of the present invention will become apparent upon consideration of the following detailed description and the accompanying drawings.

DETAILED DESCRIPTION

Figure 1:
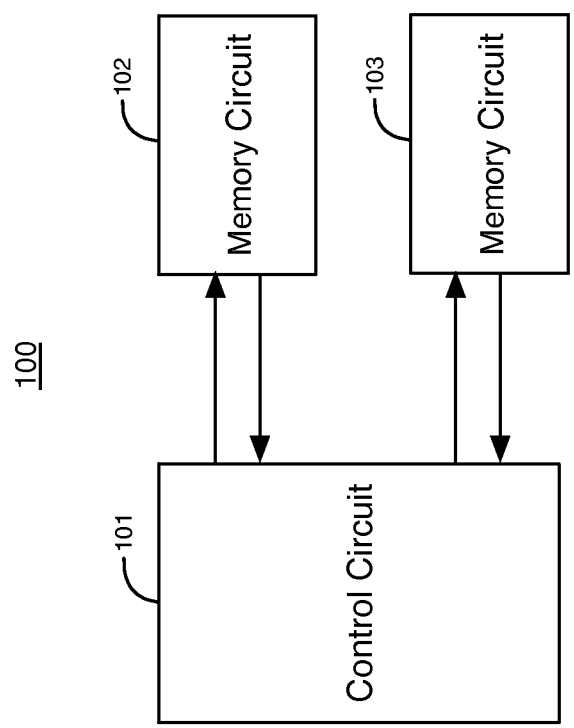
FIG. 1 illustrates an example of a data storage system, according to an embodiment of the present invention.

According to some embodiments described herein, data bits are provided for storage in memory cells of a memory circuit during a write operation. A control circuit generates redundant bits for the data bits to protect from errors caused by stuck-at faults in the memory cells. The data bits or encoded data bits are stored in the memory cells. After bits are read from the memory cells during a read operation, a control circuit uses the redundant bits to correct errors in the bits read from the memory cells that are caused by the stuck-at faults. The memory circuit may be, for example, a phase change memory circuit (e.g., that uses chalcogenide glass) or another type of memory circuit that has stuck-at faults. Data bits as described herein may include, for example, user generated bits, bits representing software code, and any other digital values.

A memory cell having a stuck-at fault is a memory cell that can only store a single digital value. A memory cell having a stuck-at fault value of 1 can only store a logic high digital value, and a memory cell having a stuck-at fault value of 0 can only store a logic low digital value. Thus, only a logic high digital value can be read from a memory cell having a stuck-at fault value of 1 (i.e., stuck-at 1), and only a logic low digital value can be read from a memory cell having a stuck-at fault value of 0 (i.e., stuck-at 0). Memory cells having stuck-at faults generally have stuck-at fault values that are stable over time.

If some of the memory cells in the memory circuit have stuck-at faults, the digital values of the stuck-at faults and the bit positions of the memory cells having the stuck-at faults are determined before the data bits or encoded data bits are stored in the memory cells. The control circuit generates the redundant bits using the digital values and bit positions of these predetermined stuck-at faults. The data bits or encoded data bits are stored in the memory cells of the memory circuit. The redundant bits may be stored in the same memory circuit or in a different memory circuit.

Subsequently, bits are read from the memory cells during a read operation and provided to a control circuit, and the redundant bits are accessed from memory and provided to the control circuit. The control circuit corrects errors in the bits read from the memory cells that are caused by the predetermined stuck-at faults using the redundant bits. The control circuit causes the bits read from the memory cells to be free of errors caused by the predetermined stuck-at faults in the memory cells.

The techniques described herein are directly applicable to multi-level memory cells. Multi-level memory cells can store more than one bit per memory cell. For example, if a memory cell holds 2 bits, and it becomes stuck, then the values of those two bits are fixed, and they can be treated as two separate stuck-at fault locations. Because the location of one of the stuck-at faults is known, the location of the other stuck-at fault is also known. As a result, for the same stuck-at fault error rate, less redundant bits can be generated for multi-level memory cells than the redundant bits that are generated for single-level memory cells. A single-level memory cell only stores one bit per memory cell. The number of redundant bits may be smaller, for example, by a factor equal to the number of bits per memory cell.

FIG. 1 illustrates an example of a data storage system 100, according to an embodiment of the present invention. Data storage system 100 includes a control circuit 101, a memory circuit 102, and a memory circuit 103. Control circuit 101 may be, for example, a memory controller circuit, a processor circuit, or any other type of control circuit. Control circuit 101 generates redundant bits for protecting from errors caused by stuck-at faults in memory cells and decodes bits read from the memory cells using the redundant bits. Bits are stored in one or both of memory circuits 102-103. Control circuit 101 may provide bits to and receive bits from memory circuits 102-103. Bits are transmitted between control circuit 101 and memory circuits 102-103 through one or more on-chip or external buses or through other types of signal lines. Control circuit 101, memory circuit 102, and memory circuit 103 may be in the same integrated circuit or in separate integrated circuits. Thus, system 100 may be a single integrated circuit device that includes circuits 101-103. Alternatively, system 100 may include three separate integrated circuit devices 101-103.

Figure 2:
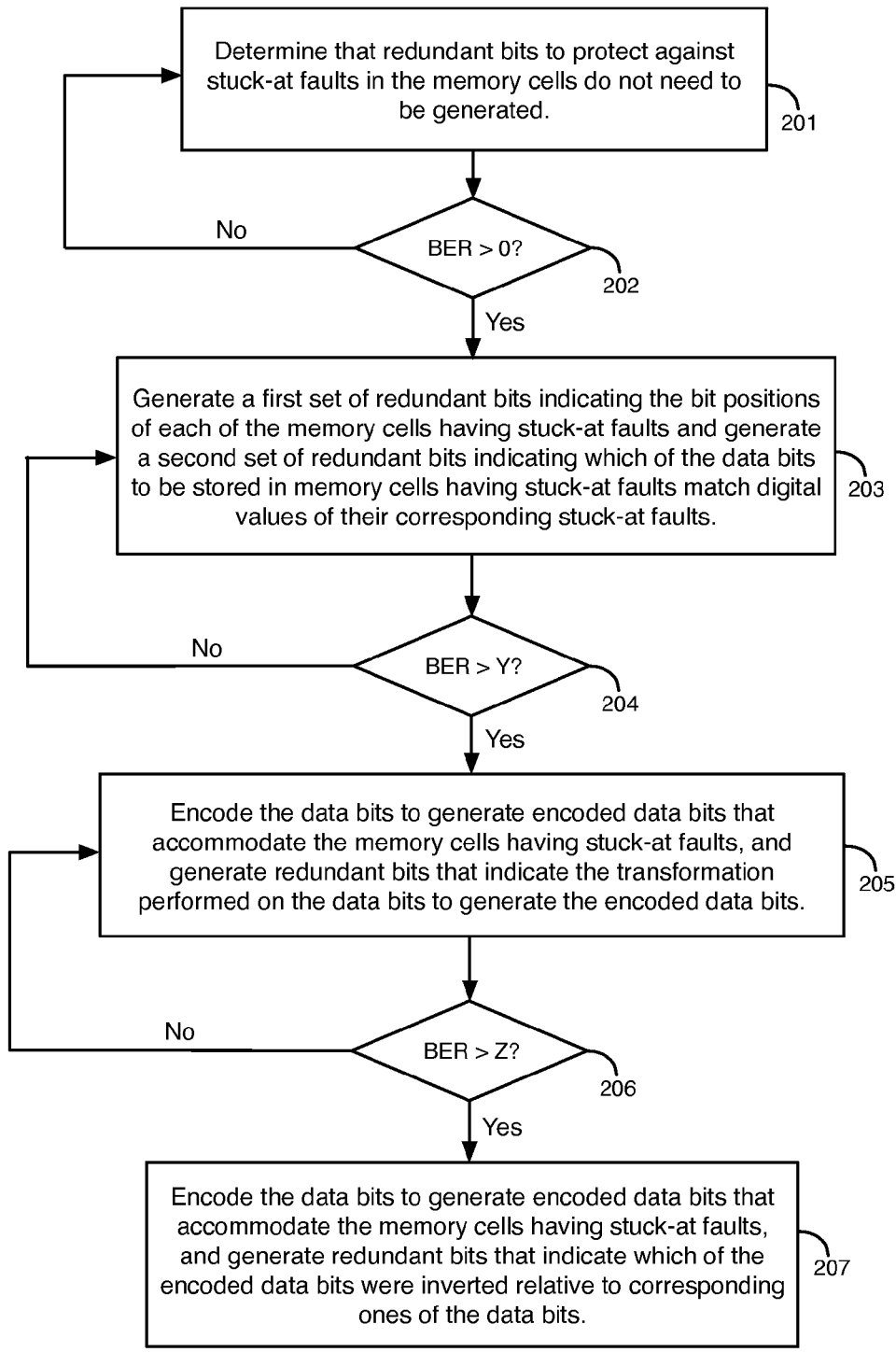
FIG. 2 is a flow chart that illustrates examples of operations for selecting an encoding technique to apply to data bits provided for storage in memory cells of a memory circuit, according to an embodiment of the present invention.

FIG. 2 is a flow chart that illustrates examples of operations for selecting an encoding technique to apply to data bits provided for storage in memory cells of a memory circuit, according to an embodiment of the present invention. The operations of FIG. 2 may, for example, be performed by control circuit 101 or a control circuit in one of memory circuits 102-103. In some embodiments, the operations of FIG. 2 are applied to a subset of the memory cells in a memory circuit, such as a page of memory cells or a bank of memory cells.

Initially, the memory cells in the memory circuit have no stuck-at faults, and the control circuit performs write operations according to operation 201. Prior to operation 201, the control circuit receives data bits that are provided for storage in memory cells of the memory circuit during a write operation. In operation 201, the control circuit determines that redundant bits to protect against stuck-at faults in the memory cells do not need to be generated, because the memory cells have not developed stuck-at faults yet. The data bits are stored in the memory cells of the memory circuit during the write operation. A read verification of the bits written to the memory cells may be performed after the write operation to verify that accurate values of the data bits were stored in the memory cells. After operation 201, the control circuit may perform one or more read operations of the bits stored in the memory cells during operation 201. During read operations to the memory cells, the control circuit does not decode redundant bits generated for the purpose of correcting errors caused by stuck-at faults.

The control circuit may perform any number of write operations according to operation 201 before going to operation 202 to evaluate the bit error rate of stuck-at faults in the memory cells. In decisional operation 202, the control circuit determines if the bit error rate (BER) of stuck-at faults in the memory cells of the memory circuit is greater than 0. The BER of stuck-at faults in a set of memory cells equals s/k, where s is the number of stuck-at faults in the memory cells, and k is the maximum number of bits that can be stored in the memory cells. If the BER of stuck-at faults in the memory cells is 0 in operation 202, then the control circuit continues to perform write operations to the memory cells of the memory circuit as described above with respect to operation 201. If the BER of stuck-at faults in the memory cells is greater than 0 in operation 202, then the control circuit generates redundant bits during write operations according to operation 203.

Figure 3:
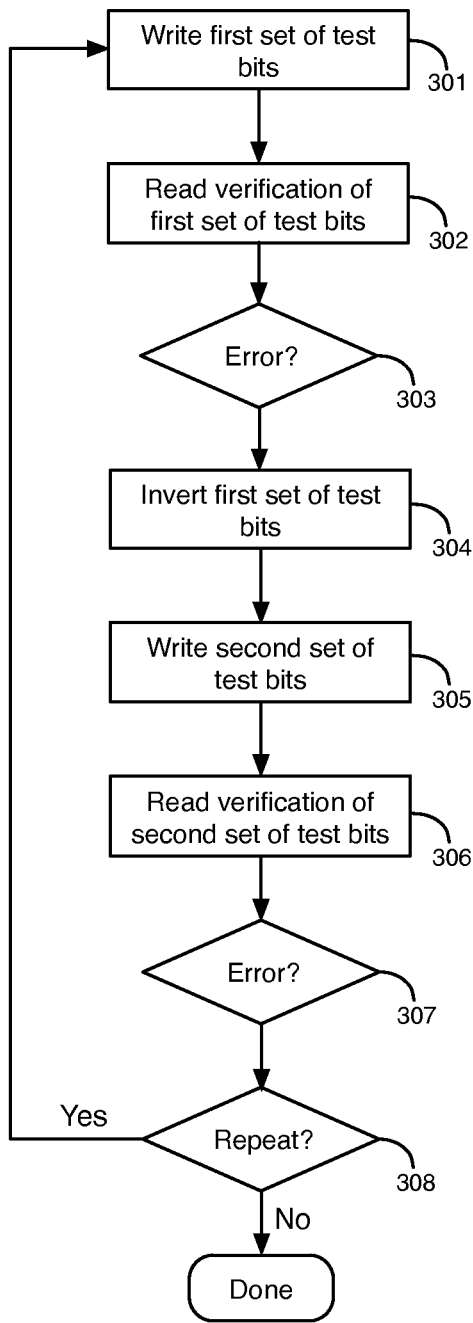
FIG. 3 illustrates examples of operations that may be performed to determine the bit error rate of stuck-at faults in the memory cells, according to an embodiment of the present invention.

FIG. 3 illustrates examples of operations that may be performed to determine the bit error rate (BER) of stuck-at faults in the memory cells, according to an embodiment of the present invention. The control circuit may determine the BER of stuck-at faults in the memory cells, for example, by performing the operations of FIG. 3. In operation 301, the control circuit writes a first set of test bits (e.g., all zero values) to the memory cells. In operation 302, the control circuit performs a read verification operation by analyzing the bits read from the memory cells to determine if the memory cells accurately stored the first set of test bits. If the control circuit determines in operation 302 that any of the bits read from the memory cells do not match corresponding ones of the first set of test bits written to the memory cells, the memory cells in the corresponding bit positions are flagged as having stuck-at faults in operation 303.

The control circuit then inverts the first set of test bits to generate a second set of test bits (e.g. all one values) in operation 304. The control circuit then writes the second set of test bits to the memory cells in operation 305. In operation 306, the control circuit performs a read verification operation by analyzing bits read from the memory cells to determine if the memory cells accurately stored the second set of test bits. If the control circuit determines in operation 306 that any of the bits read from the memory cells do not match corresponding ones of the second set of test bits written to the memory cells, the memory cells in the corresponding bit positions are flagged as having stuck-at faults in operation 307.

The control circuit stores the bit positions of the memory cells that were identified as having stuck-at faults in operations 303 and 307 and the digital values of these stuck-at faults. In operation 308, the control circuit decides whether to repeat operations 301-307 to confirm the bit positions of the memory cells having stuck-at faults and the digital values of these stuck-at faults. The control circuit may repeat operations 301-307 one, two, or more times to confirm the bit positions and digital values of the stuck-at faults. If the control circuit decides not to repeat operations 301-307, the operations of FIG. 3 are complete.

Referring again to FIG. 2, the control circuit receives data bits that are provided for storage in memory cells of the memory circuit during each write operation prior to operation 203. In operation 203, the control circuit generates a first set of redundant bits indicating the bit positions of each of the memory cells having stuck-at faults in response to a write operation. In operation 203, the control circuit also generates a second set of redundant bits indicating which of the data bits to be stored in memory cells having stuck-at faults have the same digital values as their corresponding stuck-at faults and which of the data bits to be stored in memory cells having stuck-at faults have different digital values than their corresponding stuck-at faults. The redundant bits may, for example, be generated by an encoder in the control circuit.

Examples of techniques that can be used by the control circuit in operation 203 to generate the first and second sets of redundant bits are shown in and described with respect to FIG. 2 of U.S. patent application Ser. No. 13/712,929, filed Dec. 12, 2012, which is incorporated by reference herein in its entirety. The techniques described in this patent application use a combinatorial number system. However, other techniques for generating redundant bits may be used in operation 203.

The first and second sets of redundant bits generated in operation 203 are associated with the data bits that are provided for storage in the memory cells. The control circuit provides the first and second sets of redundant bits for storage in memory during the write operation. The data bits are stored in the memory cells of the memory circuit during the write operation.

During read operations to access the data bits stored in these memory cells, data bits are read from the memory cells and provided to the control circuit. The first and second sets of redundant bits are also accessed from memory and provided to the control circuit. The control circuit decodes the data bits read from the memory cells using the first and second sets of redundant bits to correct errors in the data bits that are caused by the stuck-at faults identified prior to the write operation, as described, for example, with respect to FIGS. 3-4 of U.S. patent application Ser. No. 13/712,929, referenced above. The control circuit determines the bit positions of the memory cells having stuck-at faults based on the first set of redundant bits. The control circuit determines which of the data bits read from the memory cells to invert based on the digital values of the second set of redundant bits and the bit positions of the memory cells having stuck-at faults to correct errors in the data bits that are caused by the stuck-at faults. The control circuit may correct errors in the data bits read from the memory cells using, for example, a decoder.

The control circuit may perform any number of write operations according to operation 203 before going to operation 204 to reevaluate the BER of stuck-at faults in the memory cells. The control circuit evaluates the BER of stuck-at faults in the memory cells in decisional operation 204. The control circuit determines if the memory cells have any new stuck-at faults in operation 204. The control circuit may determine if the memory cells have any new stuck-at faults by performing the operations of FIG. 3, as described above. In an embodiment, any of the memory cells that do not accurately store the test bits are determined to have stuck-at faults.

In decisional operation 204, the control circuit determines if the BER of stuck-at faults in the memory cells is greater than a threshold value Y. Y is a number that is greater than 0. If the BER of stuck-at faults in the memory cells is less than or equal to Y in operation 204, then the control circuit generates redundant bits in operation 203 in response to the next write operation based on the most recently identified stuck-at faults.

If the BER of stuck-at faults in the memory cells is greater than Y in operation 204, then the control circuit generates encoded data bits and redundant bits in response to the next write operation according to operation 205. Prior to operation 205, the control circuit receives data bits that are provided for storage in memory cells of the memory circuit in response to a write operation. Each of the data bits is provided for storage in a corresponding one of the memory cells. In operation 205, the control circuit encodes the data bits to generate encoded data bits that accommodate corresponding memory cells having the stuck-at faults identified in operation 204. The control circuit inverts each of the data bits having a digital value that does not match the digital value of a corresponding one of the stuck-at faults to generate a corresponding one of the encoded data bits.

In operation 205, the control circuit also generates redundant bits that indicate the transformation performed on the data bits to generate the encoded data bits. The redundant bits indicate the digital values of the data bits that were inverted by the control circuit to generate the encoded data bits. In an embodiment, the redundant bits indicate whether each of the encoded data bits stored in a memory cell having a stuck-at fault was inverted or not inverted relative to a corresponding one of the data bits. The redundant bits indicate which digital values of the encoded data bits that were stored in memory cells having stuck-at faults to invert to regenerate the data bits during decoding.

Examples of techniques that can be used by the control circuit in operation 205 to generate the encoded data bits and the redundant bits are shown in and described with respect to FIGS. 10A-15 of U.S. patent application Ser. Nos. 13/649,007 and 13/649,072, filed Oct. 10, 2012, which are incorporated by reference herein in their entireties.

In an exemplary embodiment of operation 205, the control circuit generates a first set of redundant bits that indicate the bit positions of the stuck-at faults that were identified in the memory cells in operation 204 and a second set of redundant bits that indicate whether each of the encoded data bits stored in a memory cell having a stuck-at fault was inverted or not inverted relative to a corresponding data bit, as described for example, with respect to FIG. 11B of U.S. patent application Ser. Nos. 13/649,007 and 13/649,072.

According to another exemplary embodiment of operation 205, the control circuit generates the encoded data bits by inverting the data bits in regions, as described for example, with respect to FIGS. 11C-11D of U.S. patent application Ser. Nos. 13/649,007 and 13/649,072. In this embodiment, the redundant bits indicate the selected bit location of the bit positions used to create the regions in which the data bits are inverted or not inverted to generate the encoded data bits.

According to yet another exemplary embodiment of operation 205, the control circuit encodes data bits using a binary tree algorithm to generate encoded data bits that accommodate stuck-at faults in memory cells, as described for example, with respect to FIGS. 12A-12C and 13 of U.S. patent application Ser. Nos. 13/649,007 and 13/649,072. In this embodiment, the redundant bits indicate the structure of a binary tree, including the leaves and nodes of the binary tree. The redundant bits also indicate if the data bits represented by each leaf of the binary tree were inverted or not inverted to generate corresponding ones of the encoded data bits.

According to yet another exemplary embodiment of operation 205, the control circuit encodes data bits by dividing the data bits into two halves and exchanging data bits between the two halves to achieve the same number of stuck-at faults in each half, as described for example, with respect to FIGS. 14A-14C and 15 of U.S. patent application Ser. Nos. 13/649,007 and 13/649,072. Each of the halves of data bits may be subdivided into two equal quarters of data bits to generate four quarters that each has the same number of data bits. The process of exchanging data bits is then repeated for each set of two of the quarters, each set of two of eight subdivisions, etc., until each of the smallest subdivisions of data bits has exactly one stuck-at fault in its corresponding memory cells. In this embodiment, the redundant bits may indicate the bit positions of the stuck-at faults and whether each of the encoded data bits to be stored in a memory cell having a stuck-at fault was inverted or not inverted relative to a corresponding one of the data bits.

The redundant bits generated in operation 205 are associated with the encoded data bits. The control circuit provides the redundant bits for storage in memory during the write operation. The encoded data bits generated in operation 205 are stored in the memory cells of the memory circuit during the write operation, instead of the data bits.

During read operations to access the encoded data bits generated in operation 205, the redundant bits are also accessed from memory and provided to the control circuit. The control circuit decodes the encoded data bits read from the memory cells using the redundant bits to regenerate the data bits. The regenerated data bits do not contain errors caused by the stuck-at faults identified prior to the preceding write operation.

The control circuit may perform any number of write operations according to operation 205 before going to operation 206 to reevaluate the bit error rate (BER) of stuck-at faults in the memory cells. The control circuit again evaluates the BER of stuck-at faults in the memory cells in decisional operation 206. The control circuit determines if the memory cells have any new stuck-at faults in operation 206, for example, by performing the operations of FIG. 3, as described above. In decisional operation 206, the control circuit determines if the BER of stuck-at faults in the memory cells is greater than a threshold value Z. Z is a number that is greater than Y. If the BER of stuck-at faults in the memory cells is less than or equal to Z in operation 206, then the control circuit performs operation 205 during the next write operation based on the most recently identified stuck-at faults.

If the BER of stuck-at faults in the memory cells is greater than Z in operation 206, then the control circuit generates encoded data bits and redundant bits in response to the next write operation according to operation 207. Prior to operation 207, the control circuit receives data bits that are provided for storage in memory cells of the memory circuit in response to a write operation. In operation 207, the control circuit encodes the data bits to generate encoded data bits that accommodate the memory cells having stuck-at faults. The control circuit causes the encoded data bits to match the digital values of corresponding ones of the stuck-at faults. The control circuit causes the encoded data bits that are to be stored in the memory cells having stuck-at faults to match digital values of the corresponding ones of the stuck-at faults.

In operation 207, the control circuit also generates redundant bits. The redundant bits generated in operation 207 indicate which of the encoded data bits were inverted relative to corresponding ones of the data bits. As such, the redundant bits generated in operation 207 indicate which of the encoded data bits to invert to regenerate the data bits. The control circuit does not generate redundant bits that indicate the bit positions of the stuck-at faults in the memory cells in operation 207.

The redundant bits generated in operation 207 are associated with the encoded data bits. The control circuit provides the redundant bits for storage in memory during the write operation. The encoded data bits generated in operation 207 are stored in the memory cells of the memory circuit during the write operation, instead of the data bits.

During each read operation to access the encoded data bits generated in operation 207 and stored in the memory cells, the encoded data bits are read from the memory cells and provided to the control circuit. Also, the redundant bits generated in operation 207 are accessed from memory and provided to the control circuit.

In response to each read operation to access the encoded data bits generated in operation 207, the control circuit determines the bit positions of the memory cells that have stuck-at faults. To identify the bit positions of the memory cells having stuck-at faults, the control circuit may, for example, perform the operations of FIG. 3, as describe above. The control circuit writes a first set of test bits (e.g., all zero values) to the memory cells and then performs a read verification operation to determine if the memory cells accurately stored the first set of test bits. The control circuit then inverts the first set of test bits to generate a second set of test bits, writes the second set of test bits to the memory cells, and then performs a read verification operation to determine if the memory cells accurately stored the second set of test bits. Any of the memory cells that do not accurately store the first set of test bits or the second set of test bits are determined to have stuck-at faults. The control circuit may perform these operations once or multiple times to determine the bit positions of stuck-faults in the memory cells.

The control circuit decodes the encoded data bits read from the memory cells using the redundant bits and the bit positions of the memory cells that were determined to have stuck-at faults to regenerate the data bits. The regenerated data bits do not contain errors caused by the stuck-at faults.

As the write operations performed by the control circuit progress from operation 201, to operation 203, to operation 205, and then to operation 207, the endurance of the data storage system increases, because the data storage system is able to write and read accurate values from the memory circuit at greater stuck-at fault bit error rates.

However, as the write operations performed by the control circuit progress from operation 201, to operation 203, to operation 205, and then to operation 207, the performance of the data storage system decreases. More read and write operations are used to write and then read a set of bits from the memory circuit, and as a result, the time to perform read and write operations increases.

Embodiments of the present invention can, for example, be implemented using one or a combination of hardware, software, and a computer-readable medium containing program instructions. Embodiments of the present invention can be embodied as program code stored on a non-transitory computer readable medium that can be run on a computer. Software implemented by embodiments of the present invention and results of the present invention can be stored on a computer-readable medium such as semiconductor memory, phase change memory, hard disk drive, compact disc (CD), digital video disc (DVD), or other media. Results of the present invention can be used for various purposes such as being executed or processed by a processor, being displayed to a user, transmitted in a signal over a network, etc. Embodiments of the present invention may also be embodied as a computer readable program code unit stored on a non-transitory computer readable medium, for causing a number of computer systems connected via a network to affect distributed processing.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A data storage system comprising:
   a memory circuit comprising memory cells; and
   a control circuit to generate a first set of redundant bits indicating bit positions of the memory cells having stuck-at faults in response to a first write operation if a first rate of the stuck-at faults in the memory cells is greater than a first threshold, wherein first data bits are stored in the memory cells during the first write operation,
   wherein the control circuit encodes second data bits to generate first encoded data bits and a second set of redundant bits that indicate a transformation performed on the second data bits to generate the first encoded data bits in response to a second write operation if a second rate of stuck-at faults in the memory cells is greater than a second threshold, wherein the first encoded data bits are stored in the memory cells during the second write operation, and wherein the first encoded data bits stored in the memory cells having the stuck-at faults match digital values of corresponding ones of the stuck-at faults.

2. The data storage system of claim 1, wherein the control circuit generates a third set of redundant bits indicating which of the first data bits stored in the memory cells having stuck-at faults match digital values of corresponding ones of the stuck-at faults in response to the first write operation.

3. The data storage system of claim 2, wherein the control circuit encodes third data bits to generate second encoded data bits and a fourth set of redundant bits that indicate which of the second encoded data bits were inverted relative to corresponding ones of the third data bits in response to a third write operation if a third rate of stuck-at faults in the memory cells is greater than a third threshold, wherein the second encoded data bits are stored in the memory cells during the third write operation, and wherein the second encoded data bits stored in the memory cells having stuck-at faults match digital values of corresponding ones of the stuck-at faults.

4. The data storage system of claim 1, wherein the control circuit does not generate redundant bits to protect against errors caused by stuck-at faults in the memory cells in response to a third write operation if a third rate of stuck-at faults in the memory cells is less than the first threshold.

5. The data storage system of claim 1, wherein the control circuit determines the first and the second rates of stuck-at faults in the memory cells by providing a first set of test bits for storage in the memory cells, performing a read verification of the first set of test bits, inverting the first set of test bits to generate a second set of test bits, providing the second set of test bits for storage in the memory cells, and performing a read verification of the second set of test bits.

6. The data storage system of claim 1, wherein the memory circuit is a phase change memory circuit.

7. The data storage system of claim 2, wherein the control circuit decodes bits read from the memory cells using the first and the third sets of redundant bits to correct errors in the bits read from the memory cells that are caused by the first rate of the stuck-at faults, and wherein the control circuit decodes the first encoded data bits read from the memory cells using the second set of redundant bits to regenerate the second data bits.

8. The data storage system of claim 1, wherein the second set of redundant bits indicate which of the first encoded data bits stored in the memory cells having stuck-at faults in the second write operation were inverted relative to corresponding ones of the second data bits, and wherein the second set of redundant bits indicate bit positions of the stuck-at faults in the memory cells.

9. A data storage system comprising:
a memory circuit comprising memory cells, wherein the memory circuit stores first data bits in the memory cells during a first write operation; and
a control circuit to generate a first set of redundant bits indicating bit positions of the memory cells having stuck-at faults and a second set of redundant bits indicating which of the first data bits to be stored in the memory cells having stuck-at faults have different digital values than corresponding ones of the stuck-at faults in response to the first write operation if a first rate of the stuck-at faults in the memory cells is greater than a first threshold,
wherein the control circuit encodes second data bits to generate first encoded data bits and a third set of redundant bits that indicate a transformation performed on the second data bits to generate the first encoded data bits in response to a second write operation if a second rate of stuck-at faults in the memory cells is greater than a second threshold, wherein the memory circuit stores the first encoded data bits in the memory cells during the second write operation, and wherein the first encoded data bits stored in the memory cells having the stuck-at faults match digital values of corresponding ones of the stuck-at faults.

10. The data storage system of claim 9, wherein the control circuit encodes third data bits to generate second encoded data bits and a fourth set of redundant bits that indicate which of the second encoded data bits were inverted relative to corresponding ones of the third data bits in response to a third write operation if a third rate of stuck-at faults in the memory cells is greater than a third threshold, wherein the memory circuit stores the second encoded data bits in the memory cells during the third write operation, and wherein the second encoded data bits stored in the memory cells having the stuck-at faults match digital values of corresponding ones of the stuck-at faults.

11. The data storage system of claim 10, wherein the control circuit determines bit positions of the stuck-at faults in the memory cells in response to each read operation to access the second encoded data bits from the memory cells by providing a first set of test bits for storage in the memory cells, performing a read verification of the first set of test bits, inverting the first set of test bits to generate a second set of test bits, providing the second set of test bits for storage in the memory cells, and performing a read verification of the second set of test bits.

12. The data storage system of claim 10, wherein the third threshold is greater than the second threshold, and wherein the second threshold is greater than the first threshold.

13. The data storage system of claim 9, wherein the control circuit generates the first set of redundant bits using a combinatorial number system.

14. The data storage system of claim 9, wherein the third set of redundant bits indicate which of the first encoded data bits stored in the memory cells having stuck-at faults in the second write operation were inverted relative to corresponding ones of the second data bits.

15. The data storage system of claim 9, wherein the control circuit does not generate redundant bits to protect against errors caused by stuck-at faults in the memory cells in response to a third write operation if a third rate of stuck-at faults in the memory cells is less than the first threshold.

16. A method comprising:
receiving first data bits at a control circuit;
generating a first set of redundant bits indicating bit positions of memory cells in a memory circuit having stuck-at faults in response to a first write operation using the control circuit if a first rate of stuck-at faults in the memory cells is greater than a first threshold, wherein the first data bits are stored in the memory cells during the first write operation;
receiving second data bits at the control circuit; and
encoding the second data bits to generate first encoded data bits and a second set of redundant bits that indicate a transformation performed on the second data bits to generate the first encoded data bits in response to a second write operation using the control circuit if a second rate of stuck-at faults in the memory cells is greater than a second threshold, wherein the first encoded data bits are stored in the memory cells during the second write operation, and wherein the first encoded data bits stored in the memory cells having the stuck-at faults match digital values of corresponding ones of the stuck-at faults.

17. The method of claim 16, further comprising:
generating a third set of redundant bits indicating which of the first data bits stored in the memory cells having stuck-at faults match digital values of corresponding ones of the stuck-at faults in response to the first write operation using the control circuit.

18. The method of claim 17 further comprising:
receiving third data bits at the control circuit; and
encoding the third data bits to generate second encoded data bits and a fourth set of redundant bits that indicate which of the second encoded data bits were inverted relative to corresponding ones of the third data bits in response to a third write operation using the control circuit if a third rate of stuck-at faults in the memory cells is greater than a third threshold, wherein the second encoded data bits are stored in the memory cells during the third write operation, and wherein the second encoded data bits stored in the memory cells having stuck-at faults match digital values of corresponding ones of the stuck-at faults.

19. The method of claim 18 further comprising:
determining bit positions of the stuck-at faults in the memory cells in response to each read operation to access the second encoded data bits from the memory cells by providing a first set of test bits for storage in the memory cells, performing a read verification of the first set of test bits, inverting the first set of test bits to generate a second set of test bits, providing the second set of test bits for storage in the memory cells, and performing a read verification of the second set of test bits using the control circuit.

20. The method of claim 17 further comprising:
decoding bits read from the memory cells using the first and the third sets of redundant bits to correct errors in the bits read from the memory cells that are caused by the stuck-at faults using the control circuit.

21. The method of claim 17 further comprising:
decoding the first encoded data bits read from the memory cells using the second set of redundant bits to regenerate the second data bits using the control circuit.

* * * * *